United States Patent [19]

Dann

[11] 3,783,398

[45] Jan. 1, 1974

[54] FM PULSE AVERAGING DEMODULATOR

[75] Inventor: Bert H. Dann, Mountain View, Calif.

[73] Assignee: International Video Corporation, Sunnyvale, Calif.

[22] Filed: Sept. 1, 1972

[21] Appl. No.: 285,924

[52] U.S. Cl. ................ 329/50, 178/5.4 SD, 328/34, 328/133, 307/268, 329/104, 329/112

[51] Int. Cl. .......................... H03d 3/18, H03k 5/08

[58] Field of Search ...................... 329/50, 104, 112, 329/102; 328/133, 34, 35, 36, 114–117; 307/268; 325/329, 330; 178/5.4 SD

[56] References Cited

UNITED STATES PATENTS

| | | | |
|---|---|---|---|
| 2,368,448 | 1/1945 | Cook | 328/36 X |
| 2,434,965 | 1/1948 | Shepherd | 328/34 X |
| 2,510,983 | 6/1950 | Krause | 329/104 X |
| 2,571,017 | 10/1951 | Dempsey et al. | 328/34 X |
| 2,895,784 | 7/1959 | Rocha | 328/34 X |
| 3,458,729 | 7/1969 | Klein | 328/36 X |
| 3,521,084 | 7/1970 | Jones | 328/133 X |

*Primary Examiner*—Alfred L. Brody
*Attorney*—Karl A. Limbach et al.

[57] ABSTRACT

An FM pulse averaging demodulator particularly useful in high quality broadcast television video tape recorders and reproducers employing high carrier frequencies. Extremely constant area pulses are generated in response to a well limited FM signal by generating ramps in response to successive FM wave zero crossings. The ramps are applied to respective differential comparator/clipper pairs whose threshold level sets the demodulator gain. The resulting constant area pulses at each zero crossing are applied to a low pass filter which provides a demodulated signal having high linearity and excellent differential gain characteristics.

6 Claims, 2 Drawing Figures

FM PULSE AVERAGING DEMODULATOR

BACKGROUND OF THE INVENTION

The invention relates to demodulator circuits and more particularly, to an improved frequency modulation (FM) demodulator especially suited for use in a high quality television broadcast videotape recorder and reproducer (VTR).

As explained in U.S. Pat. No. 3,387,219, Demodulator Circuit for Angle-Modulation Systems by Bert H. Dann, pulse averaging demodulators are preferred over discriminator type demodulator in VTRs due to the better linearity. However, a critical requirement in pulse averaging demodulators is the generation of constant area pulses at each zero-crossing (positive and negative) of the FM signal. If the pulse areas are not substantially absolutely constant for all instantaneous carrier rates then nonlinearity results. This nonlinearity appears as differential gain which causes errors in the reproduced color signals from the VTR. In a high quality television broadcast VTR the differential gain specifications are very tight thus requiring an extremely linear FM demodulator.

A processing circuit for generating equal area pulses at the zero crossover points disclosed in the aforementioned U.S. patent is incorporated into the demodulator circuit of U.S. Pat. No. 3,426,284 entitled Transistorized Demodulator Circuit for Time Modulated Signals by Bert H. Dann. Constant area pulses from the processing circuit are used to steer a pair of differential pair transistors connected to a current source. The processing circuit employs a delay line, having a delay equal to the desired pulse width, which receives the limited FM signal 180° out of phase at each end. A problem in this approach is that even a high quality delay line generates spurious reflections which affect the pulse width (the pulse height is controlled, hence the width controls the area) and these reflections vary with the FM modulation frequency, thus resulting in pulse widths that are not constant with modulating frequency causing non-linearity and differential gain. This effect is particularly noticeable when high carrier frequencies are employed, for example 9 to 12MHz, in state of the art VTR's.

SUMMARY OF THE INVENTION

In accordance with the teachings of the present invention an FM demodulator of the pulse averaging type is provided having improved differential gain characteristics even at high carrier rates of 9 to 12 MHz. The invention includes circuitry for generating extremely constant equal area pulses at the zero crossings of the FM modulated signal. Further, the invention provides a straightforward means for adjusting the demodulator gain without affecting differential gain by changing comparator thresholds.

A well limited FM signal is applied first to a non-saturating limiter, having its own constant current source, which drives a pair of ramp generators. A potentiometer between the generators' inputs balances the initial drop of the two ramps and a potentiometer affecting the RC charging portions of the generators balances the ramp slopes, thus permitting identical ramps to be consecutively generated at each zero crossing of the square wave limited FM signal. The ramps then drive respective differential comparator and clipper pairs. The comparator threshold levels provide an adjustment of the demodulator gain and provide a constant area pulse at each succeeding positive and negative zero crossing. Since the comparators' threshold adjustments are adjustments to DC levels, the the gain adjustment is easily and inherently remotable. The resulting pulses are applied to a low pass filter as in conventional pulse averaging demodulators. The succeeding amplifier stages may be of constant gain so that any level adjustments are made in the demodulator threshold thus reducing differential gain to a minimum.

It has been found that a working embodiment of the present invention provides extremely constant area pulses even at "super high band" carrier rates of 9 to 12 MHz. The resulting differential gain characteristics equal or exceed those of prior art "low band" VTR demodulators.

These and other advantages will be better understood as the following detailed description of the invention is read and understood.

DESCRIPTION OF THE PREFERRED EMBODIMENTS

Figure 1:
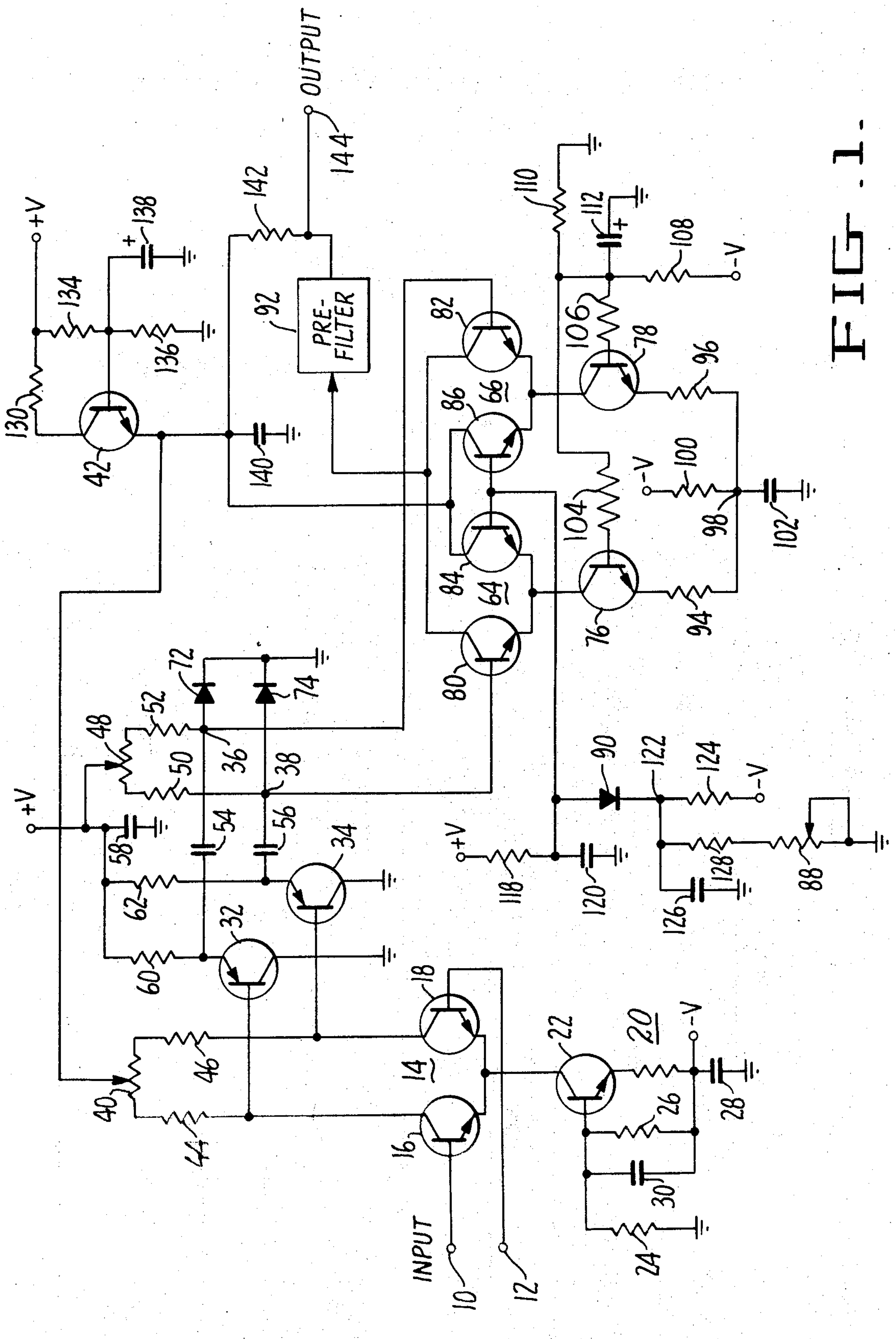
FIG. 1 is a schematic diagram of a demodulator circuit embodying the present invention.

The frequency modulated input signal is applied at input terminals 10 and 12 that are connected to a non-saturating limiter stage 14 comprising a pair of NPN transistors 16 and 18. Transistors 16 and 18 receive the input signal at their respective bases; the emitters are connected to a conventional constant current source 20 comprising an NPN transistor 22. The collector of transistor 22 provides the constant current to limiter stage 14; the base of transistor 22 is connected to the junction of voltage divider bias resistors 24 and 26 connected between ground and a negative voltage −V. Bypass capacitors 28 and 30 are connected from the −V terminal to ground and to the base of transistor 22, respectively.

A square wave signal at the FM input signal carrier rate (FIG. 2A) is provided at the collectors of the limiter 14 transistors 16 and 18 and is applied to the bases of emitter follower PNP transistors 32 and 34. Ramps (FIGS. 2B and 2C) are generated at junctions 36 and 38 in response to the alternate half cycles of the square wave signal. The square wave signal is derived by well limiting the off-tape FM signal in a VTR, for example.

The inital drops (from 0 to $-v_2$ in FIGS. 2B and 2C) of the alternate ramps is balanced by means of a potentiometer 40 that receives an intermediate voltage (+7 volts, for example, if +V is 12 volts) at its arm from the emitter of a transistor 42. This intermediate voltage provides for better recharge time in the ramp generators and allows less dissipation in the comparator-clippers 64 and 66 integrated circuit chip (described below). The ends of potentiometer 40 are connected to the collectors of transistors 16 and 18 and to the bases of transistors 32 and 34 through precision resistors 44 and 46, respectively.

The slope angles (from $t_1$ to $t_3$, $t_3$ to $t_5$, etc.) of the alternate ramps are balanced by means of a potentiometer 48 that has its arm connected to a positive voltage source +V. The ends of potentiometer 48 are connected to precision resistors 50 and 52 and then to the emitters of emitter follower transistors 32 and 34 through charging capacitors 54 and 56, respectively. The +V terminal is bypassed to ground by capacitor 58. The emitters of transistors 32 and 34 are connected to +V through resistors 60 and 62, respectively and the collectors are grounded. PNP transistors 32 and 34 act in a manner similar to diodes and by applying the intermediate voltage to their bases, their emitters return more rapidly to an established reference level thus improving the recharge time of the ramps.

Junctions 36 and 38 are connected to the respective base inputs of a differential comparator and clipper pair 64 and 66. Diodes 72 and 74 have their anodes connected to junctions 36 and 38 and function as base clamps.

A pair of current sourse NPN transistors 76 and 78 are connected to transistor pairs 64 and 66. Current flows in the "outside" NPN transistors 80 and 82 unless the negative-going signal at the base of the transistor exceeds a threshold level; then the current flows through the"inside" NPN transistor 84 or 86. The threshold level ($-v_1$, in FIGS. 2B, C, D) is set by a potentiometer 88 acting with a temperature compensating diode 90.

Figure 2:
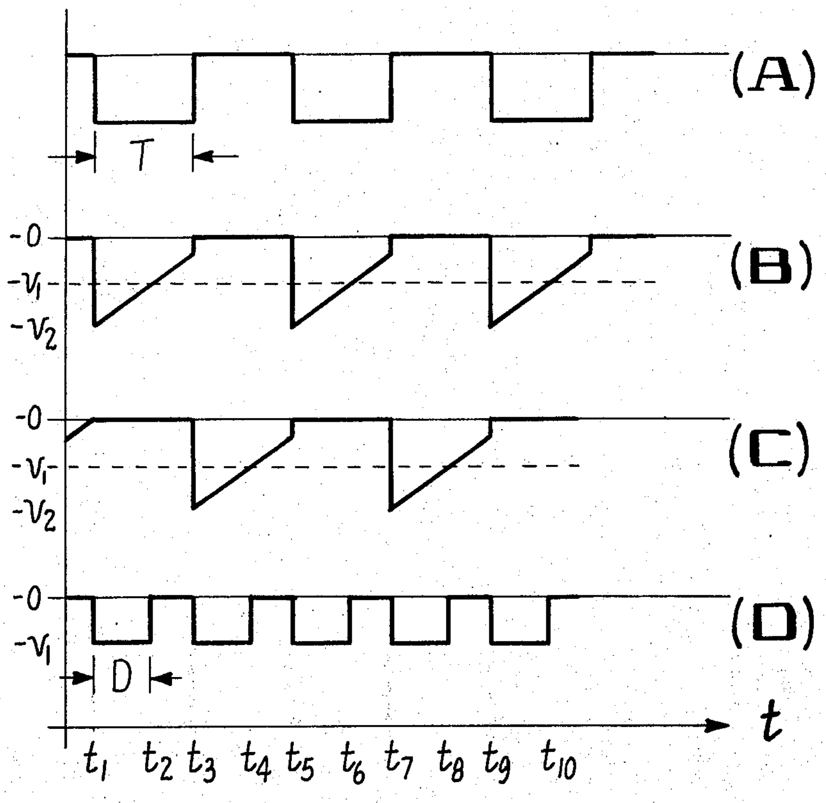
FIG. 2 is a series of waveforms useful in understanding the circuit of FIG. 1.

More specifically, these portions of the circuit are connected as follows. The collectors of transistors 80 and 82 which provide the output signal in FIG. 2D are connected together to a low pass filter 92. The emitters of transistors 80 and 84 are connected together to the collector of current source transistor 76 and similarly, the emitters of transistors 82 and 86 are connected together to the collector of current source transistor 78. The emitters of transistors 76 ane 78 are connected through resistors 94 and 96 to a junction 98. The junction is connected to a negative voltage source −V through resistor 100 and is bypassed to ground by capacitor 102.

The bases of current source transistors 76 and 78 are biased respectively by resistors 104 and 106 connected to the junction of voltage divider resistors 108 and 110 connected between a negative voltage −V and ground. The junction point is bypassed to ground by capacitor 112.

The bases of transistors 84 and 86 are connected to the anode of diode 90 which provides temperature compensation for base clamp transistors (diodes) 72 and 74. The diode 90 anode is connected to a positive voltage source +V through resistor 118 and is bypassed to ground by capacitor 120. The cathode of diode 90 is connected to a junction point 122 which is, in turn, connected to a negative voltage −V through resistor 124. The junction point 122 is also bypassed to ground by capacitor 126 and is connected to ground through resistor 128 and potentiometer 88.

Transistor 42 has its collector connected to a positive voltage source +V through resistor 130. The transistor 42 base is connected to the junction of voltage divider resistors 134 and 136 connected between +V and ground. The junction is bypassed to ground by capacitor 138. The emitter of transistor 42 is further connected to the collectors of transistors 84 and 86 and to a bypass to ground capacitor 140. The emitter of transistor 42 is also connected to the emitters of transistors 80 and 82 through load resistor 142 and the low pass filter 92.

The demodulator output is taken at terminal 144 at the pre-filter 92 output. The pre-filter is designed to reduce the 2 times carrier frequency ripple to about the same amplitude as the video level so that the dynamic range of succeeding amplifier stages (which include further low pass filtering) (not shown) is not exceeded.

In a practical embodiment of the invention the following circuit values or components are used:

| | | |
|---|---|---|
| Transistors 16, 18, 22 and Resistors 24, 26, 27 | CA 3028B integrated circuit | |
| Capacitor 28 | 0.1 $\mu$f | |
| Capacitor 30 | 0.1 $\mu$f | |
| Transistor 32 | 2N 3640 | |
| Transistor 34 | 2N 3640 | |
| Potentiometer 40 | 20 ohms | |
| Transistor 42 | 2N 4126 | |
| Resistor 44 | 158 ohm 1% | |
| Resistor 46 | 158 ohm 1% | |
| Potentiometer 48 | 500 ohms | |
| Resistor 50 | 6040 ohm | |
| Resistor 52 | 6040 ohm | |
| Capacitor 54 | 47 pf 1% | |
| Capacitor 56 | 47 pf 1% | |
| Capacitor 58 | 0.1 $\mu$f | |
| Resistor 60 | 470 ohm | |
| Resistor 62 | 470 ohm | |
| Diode 72 | FD 777 | |
| Diode 74 | FD 777 | |
| Transistor 76, 78, 80, 82, 84, 86 | CA 3054 integrated circuit | |
| Potentiometer 88 | 500 ohm | |
| Diode 90 | FD 777 | |
| Resistor 94 | 432 ohm | 1% |
| Resistor 96 | 432 ohm | 1% |
| Resistor 100 | 100 ohm | |
| Capacitor 102 | 0.1 $\mu$f | |
| Resistor 108 | 3570 ohm | |
| Resistor 110 | 2260 ohm | |
| Capacitor 112 | 15 mf | |
| Resistor 118 | 6810 ohm | 1% |
| Ca acitor 120 | 0.1 $\mu$f | |
| Resistor 124 | 2610 ohm | |
| Capacitor 126 | 330 mf | |
| Resistor 128 | 332 ohm | 1% |
| Resistor 130 | 100 ohm | |
| Resistor 134 | 1200 ohm | |
| Resistor 136 | 2400 ohm | |
| Capacitor 138 | 15 mf | |
| Capacitor 140 | 0.1 $\mu$f | |
| Resistor 142 | 255 ohm | 1% |

Also, in the practical embodiment, the equal area pulses of FIG. 2D are not perfect and exhibit a finite rise and fall time. However, this has no effect on the linearity of the circuit since each succeeding pulse is substantially identical.

It will be apparent to those of ordinary skill in the art that modifications may be made to the circuit embodiment disclosed without departing from the spirit and scope of the invention. The invention is thus to be limited only by the scope of the appended claims.

I claim:

1. A pulse averaging type FM demodulator receiving a well limited FM signal comprising:

a. means for generating first and second repetitive ramps in response to alternate successive zero crossings of said signal, b. means for generating a predetermined threshold level signal, c. means responsive to said last recited means and receiving said first and second repetitive ramps for differentially comparing and clipping said respective repetitive ramps at said predetermined threshold level, d. means for combining said compared and clipped ramps, and e. means for filtering said combined, compared and clipped ramps.

2. The combination of claim 1 further comprising means for adjusting said means for establishing a predetermined threshold level signal to thereby adjust the comparator and clipping level of said differential comparing and clipping means.

3. The combination of claim 2 further comprising means for balancing the drop or rise of said ramps.

4. The combination of claim 3 further comprising means for balancing the slope of said ramps.

5. The combination of claim 1 wherein said ramp generating means comprises first and second PNP emitter follower transistor stages receiving the input signal 180° out of phase at their bases and having the emitter of each stage connected to respective resistor-capacitor junctions of first and second series circuits each consisting of a series positive voltage source, charging resistor, capacitor, diode clamp and ground.

6. The combination of claim 2 wherein said differential comparator and clipper means comprises first and second differential comparator pair NPN transistors each connected to a respective current source and receiving the first and second repetitive ramps at the base of one of each of the NPN pairs and receiving said threshold level signal at the base of the other of the NPN pair.

* * * * *